United States Patent [19]
Tamura

[11] Patent Number: 5,522,936
[45] Date of Patent: Jun. 4, 1996

[54] THIN FILM DEPOSITION APPARATUS

[75] Inventor: Takahiro Tamura, Fuchu, Japan

[73] Assignee: Anelva Corporation, Tokyo, Japan

[21] Appl. No.: 519,732

[22] Filed: Aug. 28, 1995

[30] Foreign Application Priority Data

Sep. 30, 1994 [JP] Japan ..................... 6-261618

[51] Int. Cl.⁶ ..................... C23C 16/48; C23C 16/50
[52] U.S. Cl. ..................... 118/723 R; 118/723 ME; 118/723 ER
[58] Field of Search ............. 118/723 ME, 723 ER, 118/723 R

[56] References Cited

U.S. PATENT DOCUMENTS 4,401,054 8/1983 Matsuo ..................... 118/723 MR

Primary Examiner—Richard Bueker
Attorney, Agent, or Firm—Fay, Sharpe, Beall, Fagan, Minnich & McKee

[57] ABSTRACT

A thin film deposition apparatus forms a thin film onto substrates by use of a plasma gas and a material gas. In this apparatus, generation of particles in a deposition chamber can be reduced and hence a high quality thin film with fewer surface defects can be formed. The apparatus comprises a bell jar, a power-supply unit for supplying electric power to the bell jar, a deposition chamber, a vacuum pumping unit for evacuating the deposition chamber, a first gas introduction unit for introducing a gas used for generating plasma, and a second gas introduction unit for introducing a material gas used for forming the thin film, and further a blocking member for preventing either or both of the material gas and the plasma from entering a space between a gas supply end-portion of the second introduction unit and an interior surface of the deposition chamber. The blocking member is shaped to have relatively large curvature.

9 Claims, 6 Drawing Sheets

THIN FILM DEPOSITION APPARATUS

BACKGROUND OF THE INVENTION

1. Field of the Invention

The present invention relates to a thin film deposition apparatus, and more particularly to a thin film deposition apparatus for depositing thin films on substrates by means of material gas introduced into a processing chamber and plasma generated therein, in order to produce semiconductor devices.

2. Description of the Related Art

An example of a conventional thin film deposition apparatus will be explained by referring to FIG. 5. One type of such a thin film deposition apparatus is a plasma CVD (chemical vapor deposition) apparatus for depositing a thin silicon oxide film identical to or nearly identical to a thin thermal oxide film with respect to film quality, in which oxygen gas ($O_2$) is used for generating plasma and monosilane gas ($SiH_4$) is used as a material gas for forming the thin film.

As shown in FIG. 5, the plasma CVD apparatus includes: a bell jar 11 used as a vessel in which plasma is generated; a power-supply unit 12 for supplying electric power into the bell jar 11; a deposition chamber 13 related to the bell jar 11 spatially to make a common space; a magnetic field generating unit 14 for generating multi-cusped magnetic fields in the deposition chamber 13, which is placed around the deposition chamber 13; a vacuum pumping unit 15 for evacuating both the bell jar 11 and the deposition chamber 13; a first gas introduction unit 16 for introducing the oxygen gas ($O_2$) into the deposition chamber 13; and, a second gas introduction unit 17 for introducing the monosilane gas ($SiH_4$) into the deposition chamber 13.

The bell jar 11 of the plasma CVD apparatus is made of a dielectric material and is used as a plasma generating chamber. In practice, the bell jar 11 is made of quartz glass which has a pipe-like shape with a closed upper end and an open lower end, and whose inside diameter is about, e.g., 100 mm. The open lower end of the bell jar 11 is connected to an upper wall of the deposition chamber 13. The power-supply unit 12 shown in FIG. 5 comprises a high frequency power source 21, a matching box 22 and loop antennas 23 arranged around the bell jar 11. The high frequency power source 21 outputs high frequency power of 13.56 MHz, for example. The power-supply unit 12 is not, however, limited to the above-mentioned high frequency power unit, and other types of power-supply units may be used. The deposition chamber 13 is formed by using an aluminum alloy member of a cylindrical shape with a bottom, whose length in an axial direction is 230 mm and whose inside diameter is 360 mm. The magnetic field generating unit 14 placed around the deposition chamber 13 consists of twelve permanent magnet rods, each of which has two magnetic poles and is parallel with the axis of the deposition chamber 13. The vacuum pumping unit 15 comprises an evacuation chamber 31, two valves 32a and 32b arranged in serial stages and evacuation pumps 33. The evacuation pumps 33 include a turbo molecular pump 33a as a main evacuation pump and a dry pump 33b as a backing pump.

A substrate holder 42 used for holding a substrate 41 is disposed in a lower portion of the deposition chamber 13. The substrate holder 42 has a structure 43 for circulating heat exchange media therein and a temperature detector (not shown in the figures), both of which are used in controlling the temperature of the substrate holder 42 as desired. In addition, the substrate holder 42 is connected to a high frequency power source 44 which can supply a bias power to the substrate 41 on the substrate holder 42. The high frequency power source 44 supplies a high frequency power of 400 KHz, for example.

FIG. 6 shows a detailed structure of the second gas introduction unit 17 and a part of the structure is shown in cross section. A gas supply end-portion of the second gas introduction unit 17, which is disposed in the inside of the deposition chamber 13, is a ring-shaped pipe member 51 that supplies the material gas into the deposition chamber 13 through a number of gas outlets 52 formed therein. The gas outlets 52 are formed in the inside of the pipe member 51 so as to be arranged at regular intervals, for example. The pipe member 51 has, for example, at least one gas carrying pipe 53 attached to its outside as shown in the drawing. The ring-shaped pipe member 51 is fixed in the deposition chamber 13 by a supporting member 54 for supporting the gas carrying pipe 53 and several other supporting members 55 having the similar structures. The supporting member 54 additionally has a tube structure to connect both sides of the deposition chamber 13, and is fixed to a wall of the deposition chamber 13. The supporting member 55 is similarly fixed to the wall of the deposition chamber 13. The monosilane gas introduced through the second gas introduction unit 17 is supplied to the pipe member 51 through the supporting members 54 and the gas carrying pipe 53, and is injected into the interior space of the deposition chamber 13 through the gas outlets 52 in the pipe member 51 so that the momosilane gas is supplied to the surface of the substrate 41. The monosilane gas ejected from the gas outlets 52 flows in the direction of an arrow 56 shown FIG. 6.

When a process of depositing the thin silicon oxide film onto the surface of the substrate is continued in the above-mentioned conventional plasma CVD apparatus, the process results in such a phenomenon that the thin silicon oxide film is also deposited on the interior surface 13a of the deposition chamber 13 since it is in contact with the plasma generated therein, and further, the thin silicon oxide film will be deposited on the whole surfaces of the ring-shaped pipe member 51, the supporting members 54 and 55, and the gas carrying pipe 53, because the plasma moves to contact all surfaces in the deposition chamber 13. If the thin silicon oxide films are deposited on the various interior parts in the deposition chamber 13, the deposited thin film will generate a lot of undesirable particles before long because the thin films on the parts have strong interior stresses and therefore particles are undesirably peeled off. These particles cause surface defects on the thin silicon oxide film deposited on the substrate 41. The surface defects cause deterioration of value of the substrate with the defective thin silicon oxide film.

To explain in more detail, since the deposition chamber 13 has a relatively larger cylindrical shape with the upper and bottom ends as mentioned above, in which the height (length in the axial direction of the deposition chamber 13) is 230 mm and the inside diameter is 360 mm, the interior surface 13a in the side wall of the deposition chamber 13 can be shaped in the cylindrical shape without any sharp angle portions or small curvature portions. In consequence, the thin silicon oxide films deposited on the interior surface 13a have a low internal stress and therefore can be deposited to become relatively thick before starting to peel off. On the other hand, the pipe member 51, the supporting members 54 and 55, and the gas carrying pipe 53 are formed in shapes having small curvature portions, for example, a pipe shape whose radius of curvature is about 5 mm. Further connecting portions between the pipe member 51 and the supporting member 54 include sharp angle portions, or the supporting members 54 and 55 are formed by metal plates having sharp angle portions. Accordingly, when the thin silicon oxide film is deposited onto the surfaces of the portions having small radius of curvature or sharp angle portions, the internal stress of the film becomes very strong. Therefore, the problem of peeling-off in a very small thickness occurs when using the conventional deposition chamber 13.

SUMMARY OF THE INVENTION

An object of the present invention is to provide a thin film deposition apparatus for forming a thin film on substrates by use of a plasma gas and a material gas, in which generation of particles in a deposition chamber can be reduced in order to form a high quality thin film with fewer surface defects.

A thin film deposition apparatus according to the present invention comprises a plasma generating chamber, a power-supply unit for supplying electric power to the plasma generating chamber, a deposition chamber spatially connected with the plasma generating chamber, a vacuum pumping unit for evacuating the plasma generating chamber and deposition chamber, a first gas introduction unit for introducing a gas used for generating plasma into the deposition chamber, and a second gas introduction unit for introducing a material gas used for forming a thin film on a substrate into said deposition chamber. And further, as a feature configuration, the apparatus comprises a blocking member for preventing either or both of the material gas and the plasma from entering a space between a gas supply end-portion of the second introduction unit and an interior surface of the deposition chamber.

In the thin film deposition apparatus, the blocking member is preferably arranged so as to cover the space.

In the thin film deposition apparatus, the blocking member has preferably a shape having relatively large curvature.

In the thin film deposition apparatus, various members disposed in the space between the gas supply end-portion and the interior surface, each of which has portions of relatively small curvature or sharp angle, are covered by the blocking member.

In the thin film deposition apparatus, the blocking member may be electrically insulated from the deposition chamber by means of insulators.

In the thin film deposition apparatus, the blocking member has preferably an annular shape whose exterior portion is opened to have a vertical section like a letter "U" turned sideways and gas outlets that are located in positions respectively identical to positions of gas outlets formed in the supply end-portion, and is arranged so as to cover the gas supply end-portion together with the space.

In the thin film deposition apparatus, two exterior edges of the blocking member are electrically insulated from the deposition chamber by means of two ring-shaped insulators.

In accordance with the thin film deposition apparatus of the present invention, the gas used for generating plasma is introduced into both the deposition chamber and the bell jar by the first gas introduction unit, and the electric power is supplied into the bell jar, and finally the plasma is generated in the bell jar owing to interaction between each of gas molecules and the electric power. Next, the material gas is introduced into the deposition chamber. Since the deposition chamber is filled with the plasma, the material gas and the plasma interact chemically to generate components of the thin film. When oxygen gas is used as the gas for generating the plasma and monosilane gas is used as the material gas, silicon oxide and water are generated. The generated thin film components are deposited onto the substrate, and also on the interior surface of the deposition chamber together with the surface of the blocking member. Since the blocking member is disposed in the deposition chamber in order to prevent the plasma and the material gas from entering the space between the gas supply end-porion of the second introduction unit and the interior surface of the deposition chamber, the thin film can be prevented from being deposited onto the supporting members or the gas carrying pipe and the like associated with the gas supply end-portion. Since the blocking member is formed to have potions of relatively large curvature like the interior surface of the deposition chamber and not to have potions of relatively small curvature and sharp angle, the thin film deposited on the blocking member has relatively weak stress and hence can be deposited thereon to have considerable thickness before peeling-off. Consequently, the generation of particles is reduced and a thin film with a high quality can be formed for a long term.

BRIEF DESCRIPTION OF THE DRAWINGS

A preferred form of the present invention is illustrated in the accompanying drawings in which.

DESCRIPTION OF THE PREFERRED EMBODIMENT(S)

Figure 1:
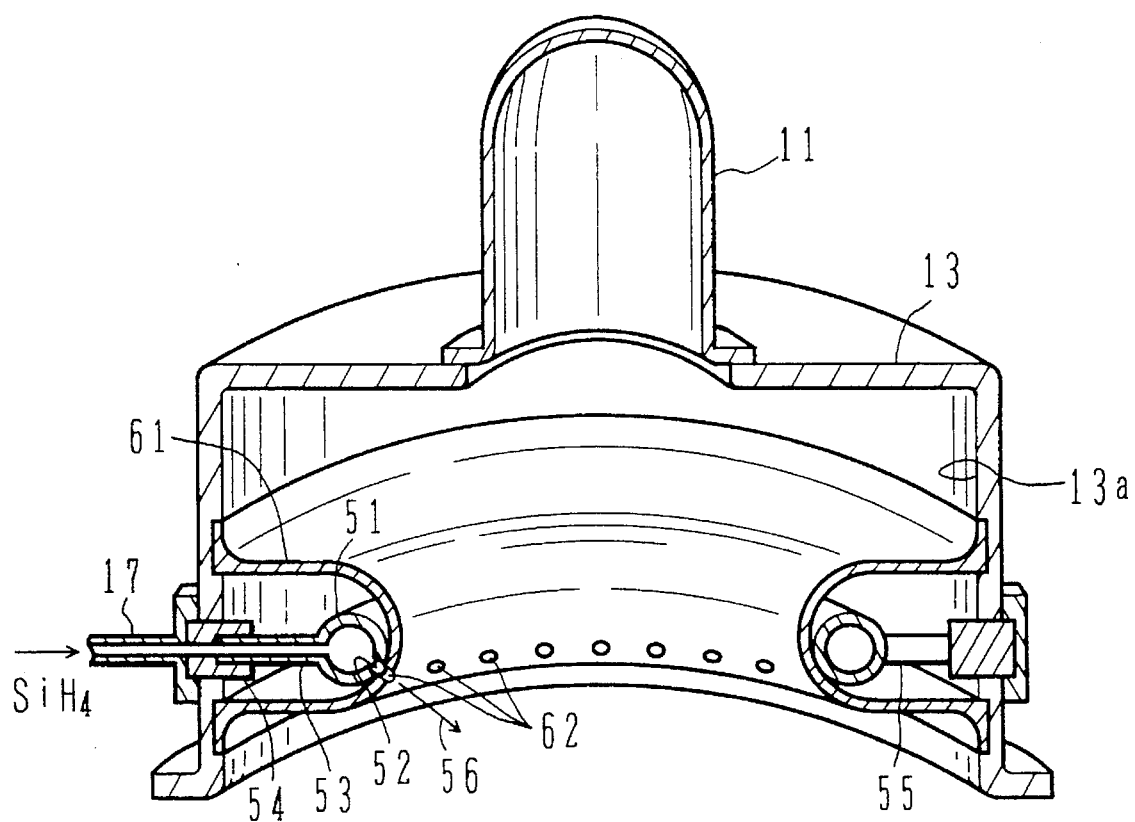
FIG. 1 is a partially schematic sectional view showing a thin film deposition apparatus of the present invention.

A typical embodiment of the present invention as illustrated in FIG. 1 shows especially a characteristic configuration in the thin film deposition apparatus of the present invention. Fundamental configurations of this thin film deposition apparatus are substantially identical to the configurations of the conventional thin film deposition apparatus illustrated in FIGS. 5 and 6, and therefore are not shown in FIG. 1. The thin film deposition apparatus of this embodiment is a plasma CVD apparatus and hence is equipped with the components shown in FIG. 1. That is, the thin film deposition apparatus also includes: the bell jar 11 used as a vessel to generate plasma therein; the power-supply unit 12 for supplying high frequency electric power into the bell jar 11; the deposition chamber 13 spatially connected with the bell jar 11; the magnetic field generating unit 14 for generating the multi-cusped magnetic fields in the deposition chamber 13, which is arranged around the deposition chamber 13; the vacuum pumping unit 15 for evacuating both the bell jar 11 and the deposition chamber 13; the first gas introduction unit 16 for introducing the gas used for generating the plasma such as oxygen gas e.g. into the deposition chamber 13; and, the second gas introduction unit 17 for the material gas used for depositing the thin film such as monosilane gas e.g. The substrate holder 42 for supporting the substrate 41 is also placed in the deposition chamber 13 and is connected to the high frequency power source so as to apply a bias voltage to the substrate 41. The second gas introduction unit 17 has the ring-shaped pipe member 51 in its gas supply end portion which is located in the deposition chamber 13. The pipe member 51 is fixed in the deposition chamber 13 by the supporting member 54, used for supporting the gas carrying pipe 53, and several supporting members 55 similar to the member 54.

In this embodiment, the oxygen gas for generating an oxygen plasma and the monosilane gas as the material gas for forming the thin film are supplied into the deposition chamber 13 and consequently a thin silicon oxide film may be deposited onto the substrate 41 based on a chemical reaction between the oxygen plasma and the monosilane gas.

Further, the thin film deposition apparatus of the present invention is not limited to the above-mentioned plasma CVD apparatus. Further, the magnetic field generating unit 14 may optionally be removed from the apparatus of the present invention.

The characteristic configuration will be explained in accordance with FIG. 1. As shown in FIG. 1, the ring-shaped pipe member 51 of the second gas introduction unit 17, which is a gas supply end-portion placed in the deposition chamber 13, has several gas outlets 52 which are, for example, arranged at regular intervals along a ring-shaped interior surface thereof. In addition, the pipe member 51 has at least one gas carrying pipe 53 attached to its exterior side and used for supplying the monosilane gas to the pipe member 51 from a gas source. The monosilane gas introduced by the gas introduction unit 17 is supplied to the pipe member 51 through the gas carrying pipe 53 and injected through the gas outlets 52 into the deposition chamber 13. Thus, the monosilane gas as the material gas is supplied to a front space for the surface of the substrate 41 to be processed. An arrow 56 as a mark shows the flow of the monosilane gas.

Figure 2:
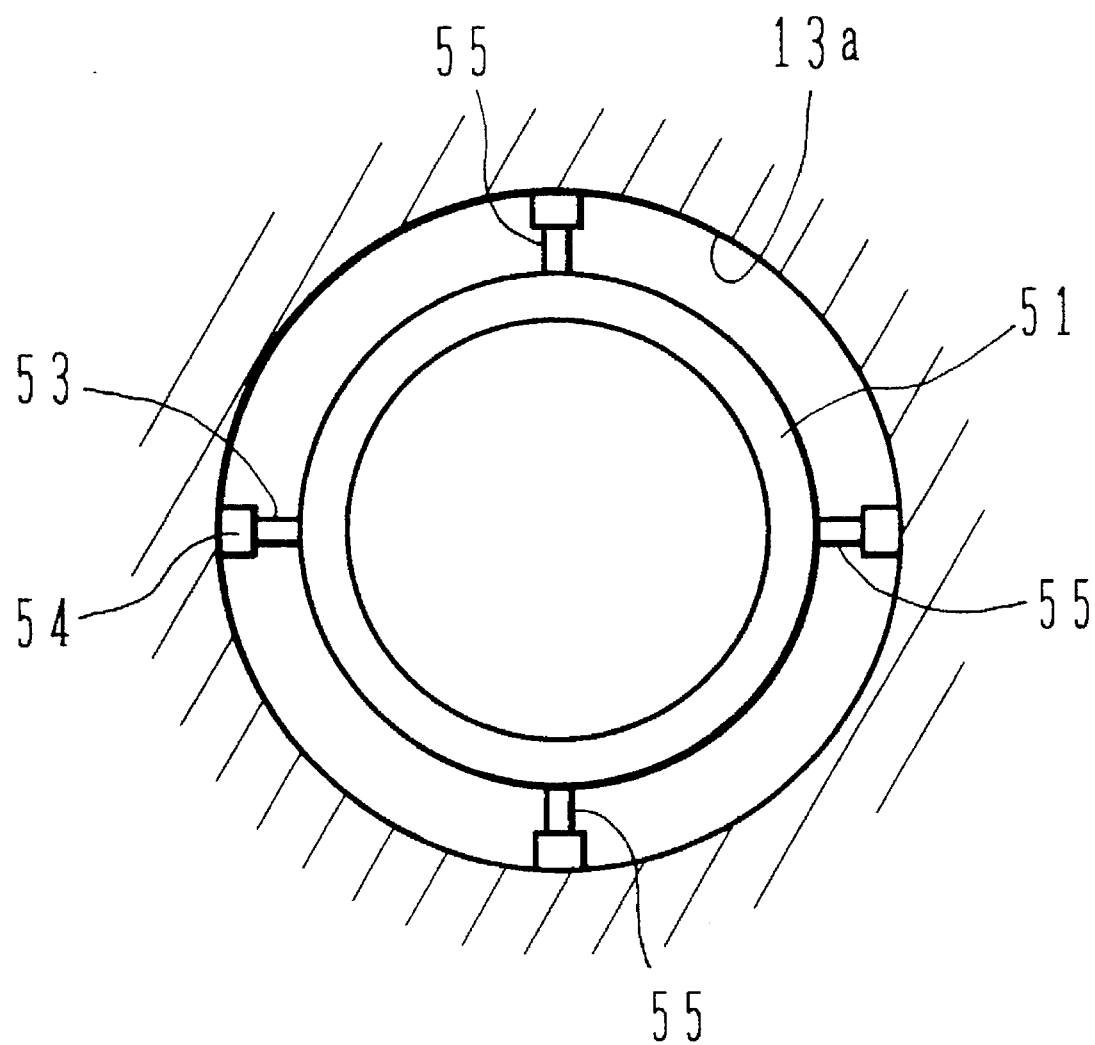
FIG. 2 is a top view showing a supporting configuration for supporting a pipe member.

As shown in FIG. 2, the ring-shaped pipe member 51 is fixed to the inside surface 13a of the deposition chamber 13 by means of the gas carrying pipe 53 and the supporting member 54 for supporting the pipe 53 together with three supporting members 55 being the same as the combination of the pipe 53 and the member 54 in shape.

As shown in FIG. 1, a blocking member 61 is arranged in the deposition chamber 13 so as to prevent either or both of the material gas, supplied to the deposition chamber 13, and the plasma, diffused from the bell jar 11 into the deposition chamber 13, from entering a space between the ring-shaped pipe member 51 and the interior surface 13 of the deposition chamber 13. The blocking member 61 is shaped as an annular housing in which its exterior portion facing the interior surface 13 is opened and therefore its vertical section has a shape like the letter "U" turned sideways, and the pipe member 51, the gas carrying pipe 53 and the supporting members 54 and 55 may be covered with the blocking member 61. The blocking member 61 includes a bend portion of relatively large curvature because the section shaped like the letter "U" has a relatively large curvature. In other words, a portion of relatively small curvature or a portion having a sharp angle is not formed in the surface of the blocking member 61, with which the material gas (i.e. the monosilane gas) or the plasma (i.e. the oxide plasma) may come in contact, and on which the thin silicon oxide films may be deposited, because such a portion would make it possible to cause the thin films formed on the portion to peel off owing to high internal stresses of the thin films, even if the thin films are sufficiently thin. Desirable curvature values for the portion having the relatively large curvature in the blocking member 61 will be decided depending upon the kind of thin film to be deposited on the substrate. Exterior peripheral edges of the blocking member 61 are fixed on the interior surface 13a of the deposition chamber 13 in a gas tight joint. In fixing the exterior peripheral edges on the interior surface 13a, welding or fastening with a shielding member therebetween is preferably used, for example. Further, the blocking member 61 has a number of gas outlets 62 in its interior portion, which respectively correspond to the gas outlets 52 of the above-mentioned pipe member 51 in their positional relationship.

The blocking member 61 disposed in the deposition chamber 13 as mentioned above can prevent either or both of the plasma, which is generated in the bell jar 11 and diffused into the deposition chamber 13, and the monosilane gas, introduced by the second gas introducing unit 17, from entering the space between the pipe member 51 and the interior surface 13a of the deposition chamber 13. Thus, the blocking member 61 can prevent either or both of the plasma and the monosilane gas from contacting the surface of the pipe member 51, the surface of the gas carrying pipe 53, or the surfaces of the supporting members 54 and 55. Therefore, depositing the thin silicon oxide films onto the surfaces of these portions can be prevented.

As to the blocking member 61, its position to be fixed in the deposition chamber 13 or its shape can be modified as long as the above-mentioned conditions are satisfied.

Figure 3:
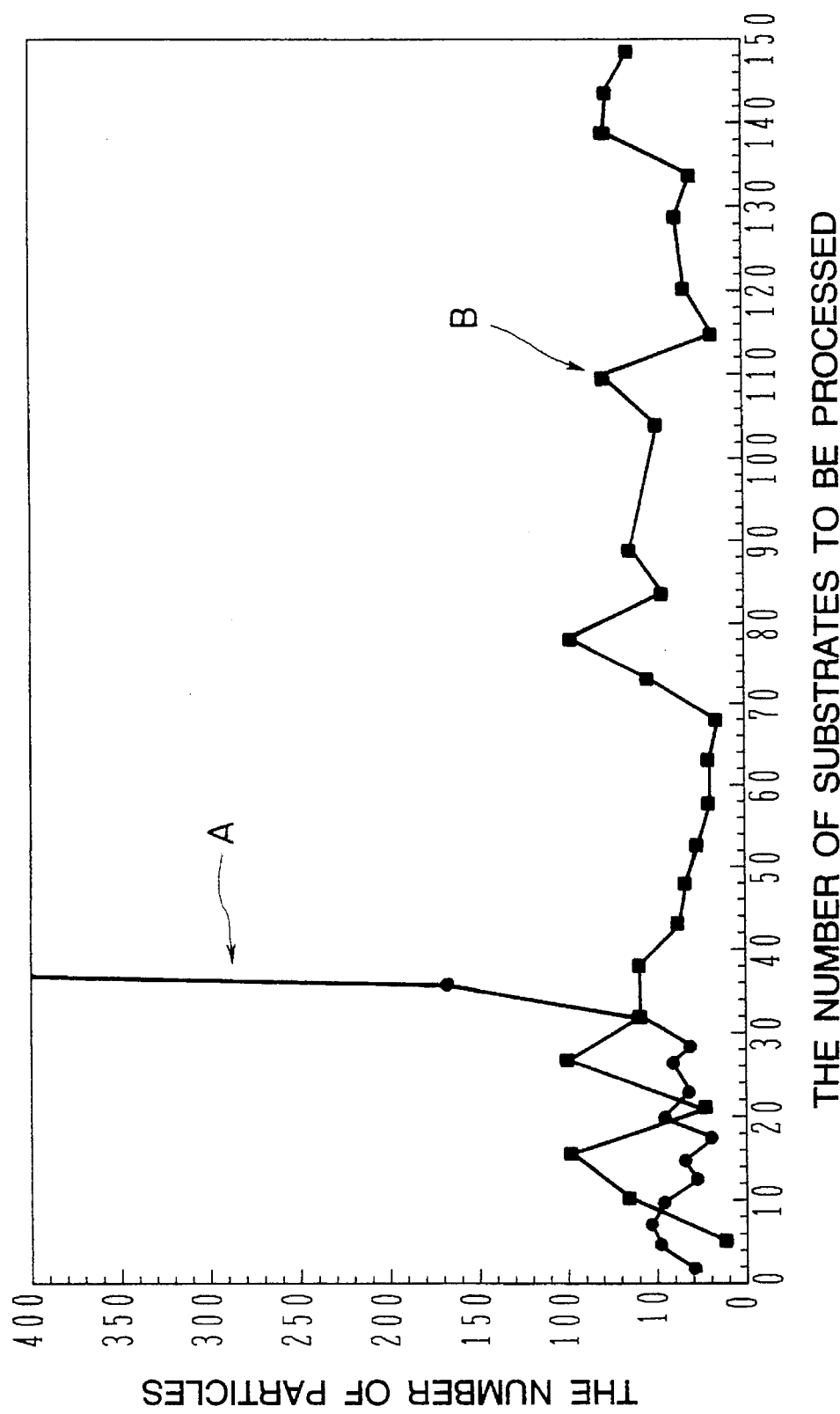
FIG. 3 is a graphical representation showing the comparison between forming a thin film by the apparatus of the present embodiment and the conventional apparatus.

FIG. 3 is a graph showing the variation in the number of particles on the surface of a 6 inch silicon semiconductor substrate with respect to the change in the number of substrates to be processed when depositing a thin silicon oxide thin film on the substrate to a thickness of 1 μm. In FIG. 3, the ordinate axis shows the number of particles, and the abscissa axis shows the number of semiconductor substrates which have been processed. The particles which have been countered are those that have a size equal to or more than 0.3 μm in diameter and that exist within a circle area of 140 mm diameter on the 6 inch substrate.

Figure 4:
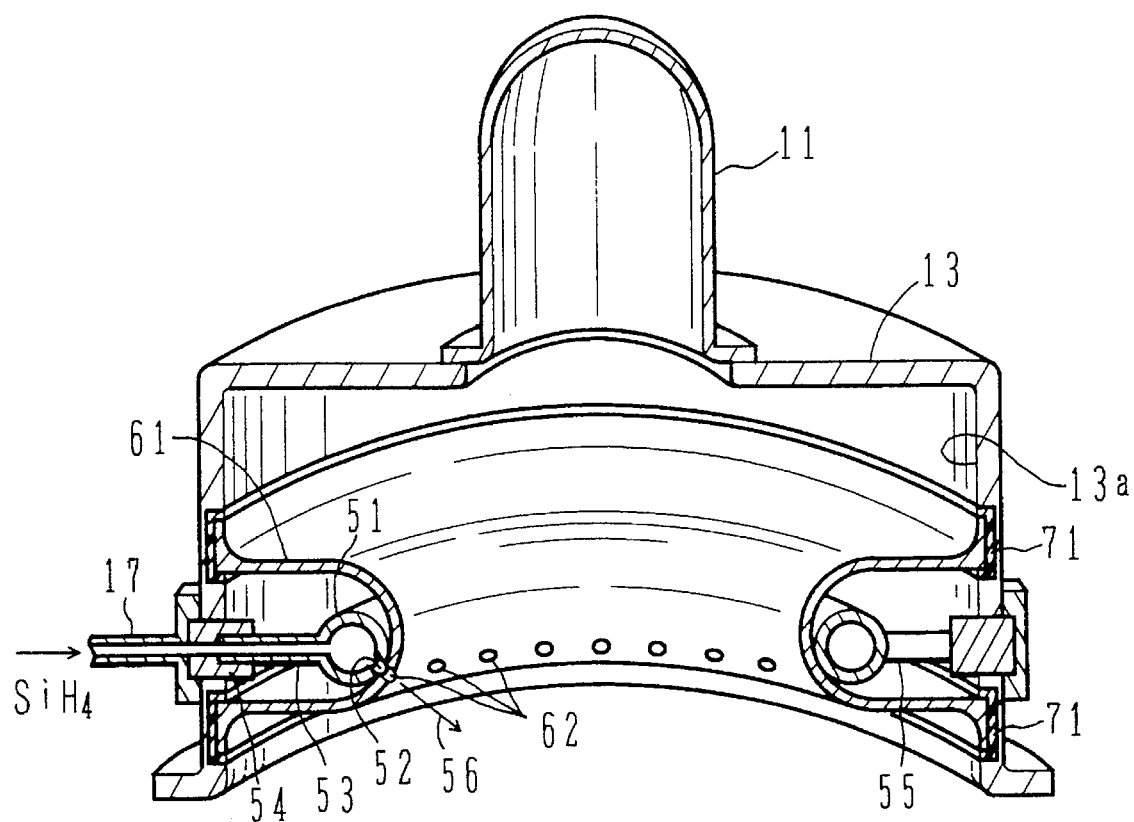
FIG. 4 is a partially schematic sectional view showing another embodiment.
Figure 5:
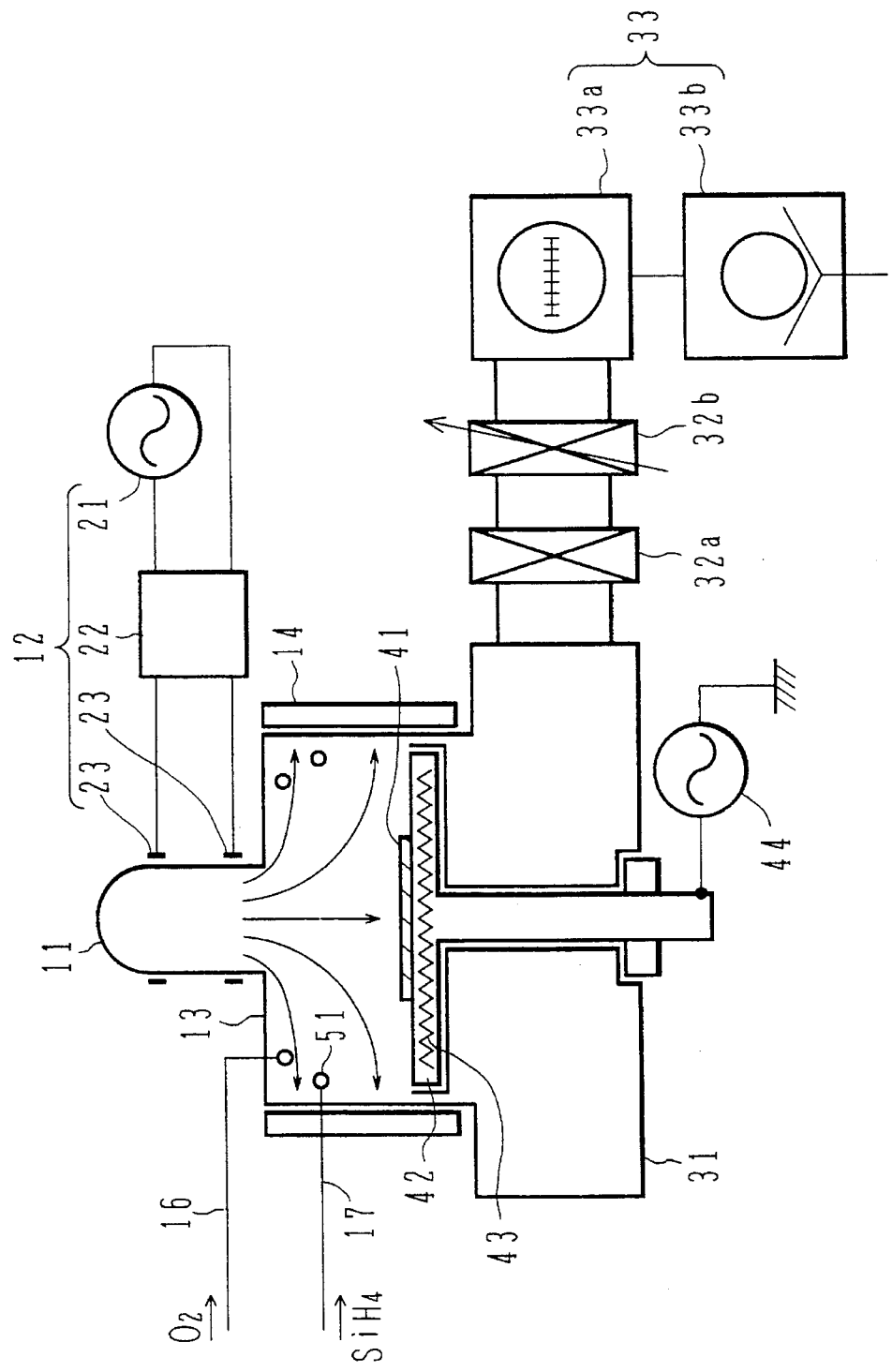
FIG. 5 is a basic system diagram showing a conventional thin film deposition apparatus.
Figure 6:
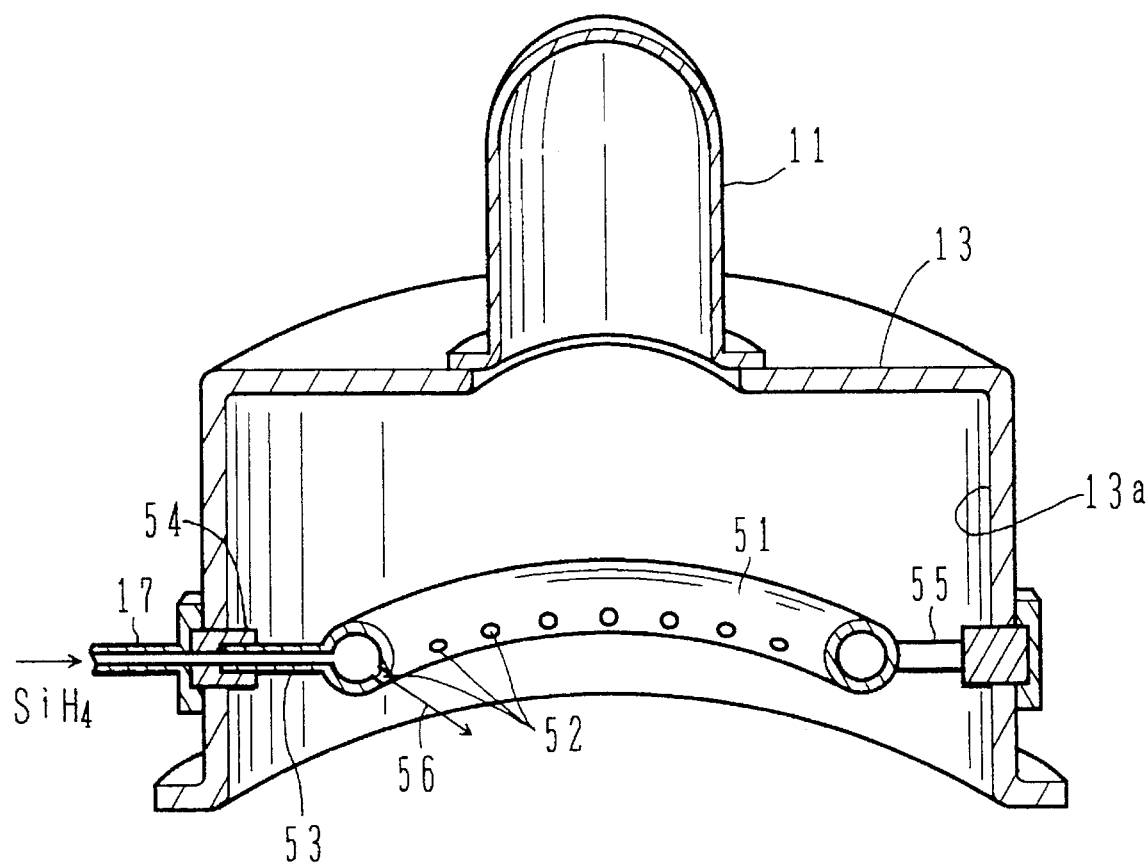
FIG. 6 is a partially schematic sectional view showing a detailed structure of a second gas introduction unit in the conventional apparatus.

In the graph shown in FIG. 3, the characteristic line A including marks "•" indicates the variation in the number of particles when using the conventional thin film deposition apparatus as show in FIGS. 4 and 5, and the characteristic line B including marks "■" indicates the variation in the number of particles when using the thin film deposition apparatus with the blocking member 61 (shown in FIG. 1) explained in the above-mentioned embodiment of the present invention.

The characteristic line A shows a remarkably increasing change in the number of particles when the number of the semiconductor substrates to be processed becomes about thirty-five. The number of particles is beyond one hundred and fifty and further comes up to tens of thousands. The portion showing the tens of thousands particles is omitted in FIG. 3. In this situation, when observing the pipe member 51 which has been removed from the deposition chamber 13, the peeling-off phenomenon of the thin film deposited on connection portions between the pipe member 51 and the supporting member 54 can be confirmed. Accordingly, the peeling-off phenomena can be considered as a major cause for the particles suddenly increasing.

On the other hand, the characteristic line B shows that the number of particles is kept to be equal or lower than a hundred even when the number of semiconductor substrates to be processed becomes a hundred and fifty. In this situation, when observing the blocking member 61 and the pipe member 51 as a supply end-portion of the second gas introduction unit 17, both of which are removed from the deposition chamber 13, there is no peeling-off of the thin silicon oxide films deposited on the surface of the blocking member 61 and also no deposition of the films on the surface of the pipe member 51.

Thus, the configuration where the pipe member 51 is fixed to the interior surface 13a of the deposition chamber 13 by means of the supporting members 54 and 55; the blocking member 61 has the predetermined shape as mentioned above and is disposed in the deposition chamber 13 arranged and shaped so as to cover all of the pipe member 51, the gas carrying pipe 53 and the supporting members 54 and 55; makes it possible to prevent the thin silicon oxide film from being deposited on portions of sharp angle or of relatively small curvature in the gas carrying pipe 53 and the supporting members 54 and 55, and on the portions of the pipe member 51 facing the interior surface 13a. Therefore, the number of particles generated in the deposition chamber 13 can be controlled suitably.

As shown in FIG. 4, the blocking member 61 may be electrically insulated from the deposition chamber 13 by placing ring-shaped insulators 71 between the blocking member 61 and the deposition chamber 13, and thereby loss of charged particles in the plasma can be decreased. Consequently, the plasma can be kept in a high density so as to make continued plasma discharge stable and effective, and therefore the deposition rate of the thin silicon oxide film can be kept to a desirable level. According to the configuration shown in FIG. 4, both of the deposition chamber 13 and the blocking member 61 are made from a conductive material and the insulator 71 is placed between them. As another embodiment, the blocking member can be made from an insulating material.

In the above-mentioned embodiment, the blocking member is arranged so as to cover a gas supply end-portion of the second gas introduction unit 17 for introducing the material gas, which is placed in the interior space of the deposition chamber 13. However, as another configuration, the like blocking member may be arranged to cover a gas supply end-portion of the first gas introduction unit for introducing the gas used for generating the plasma. Also, the later gas supply end-portion is placed in the deposition chamber. Further, both of the gas supply end-portions of the first and second gas introduction units may be covered by a single common blocking member.

The following technical advantages can be attained in accordance with the present invention.

Since the deposition apparatus for depositing a thin film onto the surface of the substrate by use of plasma and the material gas is equipped with the blocking member disposed in the surrounding space of the gas supply portion of the material gas introduction unit, either or both of the plasma and the material gas can be prevented from entering the space between the gas supply end-portion and the interior surface of the deposition chamber. Thus, depositing of the thin film on the portions with small curvature or sharp angle is prevented. Consequently, the generation of very small particles can be decreased in the deposition chamber and therefore a high-quality thin film with very less surface defects can be deposited on the substrate.

Further, even if a thin film might be deposited on the surface of the blocking member, since it has a shape of relatively large curvature, the generation of particles is reduced so that the thickness of the film can become relatively large, and consequently the thin film with a high quality can be formed on the substrate.

The electric insulator arranged between the blocking member and the deposition chamber can suppress the loss of discharged particles in the plasma. Therefore, the plasma state can be kept at a high-density and continued plasma discharge can be stable and effective. In addition, the deposition ratio of the thin silicon oxide film can be held to be desirable state.

What is claimed is:

1. A thin film deposition apparatus comprising a plasma generating chamber, a power-supply unit for supplying electric power to said plasma generating chamber, a deposition chamber spatially connected with said plasma generating chamber, a vacuum pumping unit for evacuating said plasma generating chamber and deposition chamber, a first gas introduction unit for introducing a gas used for generating plasma into said deposition chamber, and a second gas introduction unit for introducing a material gas used for forming a thin film on a substrate into said deposition chamber, comprising:

a blocking means for preventing either or both of said material gas and said plasma from entering a space between a gas supply end-portion of said second introduction unit and an interior surface of said deposition chamber.

2. A thin film deposition apparatus according to claim 1, wherein said blocking means is arranged so as to cover said space.

3. A thin film deposition apparatus according to claim 1, wherein said blocking means has a shape having relatively large curvature.

4. A thin film deposition apparatus according to claim 1, wherein members disposed in the space between said gas supply end-portion and said interior surface, each of which has portions of relatively small curvature or sharp angle, are covered by said blocking means.

5. A thin film deposition apparatus according to claim 1, wherein said blocking means is electrically insulated from said deposition chamber by means of insulators.

6. A thin film deposition apparatus according to claim 1, wherein said blocking means has an annular shape whose exterior portion is opened to have a vertical section like a letter "U" turned sideways and gas outlets that are located in positions respectively identical to positions of gas outlets formed in said gas supply end-portion, and is arranged so as to cover said gas supply end-portion together with said space.

7. A thin film deposition apparatus according to claim 6, wherein said blocking means has a shape having relatively large curvature.

8. A thin film deposition apparatus according to claim 6, wherein members disposed in the space between said gas supply end-portion and said interior surface, each of which has portions of relatively small curvature or sharp angle, are covered by said blocking means.

9. A thin film deposition apparatus according to claim 6, wherein two exterior edges of said blocking means are electrically insulated from said deposition chamber by means of two ring-shaped insulators.

* * * * *